US006985013B2

(12) United States Patent
Mallinson (10) Patent No.: US 6,985,013 B2
(45) Date of Patent: Jan. 10, 2006

(54) VOLTAGE TO CURRENT CONVERTER

(75) Inventor: Andrew Martin Mallinson, Kelowna (CA)

(73) Assignee: Ess Technology, Inc., Fremont, CA (US)

( * ) Notice: Subject to any disclaimer, the term of this patent is extended or adjusted under 35 U.S.C. 154(b) by 0 days.

(21) Appl. No.: 10/865,176

(22) Filed: Jun. 9, 2004

(65) Prior Publication Data

US 2004/0232950 A1    Nov. 25, 2004

Related U.S. Application Data

(63) Continuation of application No. 10/443,154, filed on May 21, 2003, now Pat. No. 6,765,417.

(51) Int. Cl.
*H02M 11/00* (2006.01)
(52) U.S. Cl. ............................ 327/103; 327/52; 327/63
(58) Field of Classification Search .................. 327/52, 327/63, 103, 561, 562, 563
See application file for complete search history.

(56) References Cited

U.S. PATENT DOCUMENTS

| | | | | |
|---|---|---|---|---|
| 5,523,717 A | * | 6/1996 | Kimura | ....................... 330/252 |
| 5,801,655 A | * | 9/1998 | Imamura | ...................... 341/145 |
| 6,346,899 B1 | * | 2/2002 | Hadidi | ........................ 341/144 |
| 6,680,627 B2 | * | 1/2004 | Hughes | ....................... 327/103 |
| 2004/0233085 A1 | * | 11/2004 | Fukuda | ....................... 341/143 |

* cited by examiner

*Primary Examiner*—Terry D. Cunningham
(74) *Attorney, Agent, or Firm*—Stevens Law Group, P.C.

(57) ABSTRACT

The invention provides a method and apparatus for performing a voltage to current conversion. In particular, the invention provides a voltage to current converter configured to vary its transconductance ($G_m$). Such a converter is configured to receive a voltage input signal combined with a reference voltage signal to be converted to a current output. Optionally, the reference voltage signal may be provided by a parabolic impedance network that includes a bank of resistors and a plurality of corresponding current sources. Each current source corresponds to each node between two resistors, and may be varied in order to program changes in the comparator's $G_m$. Each resistor and corresponding current source is configured to create an individual reference voltage reference having a value that occurs in a parabolic manner in relation to other voltage references occurring across the impedance network. The converter further includes a plurality of comparators corresponding to the plurality of voltage reference signals. The reference voltage is summed together with an input voltage to an input of each corresponding comparator. Each comparator is configured to receive an enabling signal source for receiving an enabling signal. The comparator includes a comparator output that outputs a signal when the comparator is enabled. The enablement signal source is configured to provide a variable input signal to vary the $G_m$ of the overall converter.

12 Claims, 7 Drawing Sheets

VOLTAGE TO CURRENT CONVERTER

This a CON of Ser. No. 10/443,154 field on May 21, 2003 now U.S. Pat. No. 6,765,417

BACKGROUND

The invention generally relates to voltage to current converters and, more particularly, to a voltage to current converter configured with variable transconductance ($G_m$).

Voltage-to-current converters are implemented in many conventional applications. Related transconducting devices are electronic building blocks characterized by a current output derived from a voltage input in a linear relationship $I_{out}=G_m*V_{in}$, where $G_m$ is transconductance, and where Seimens (S) is the standard unit of $G_m$ in Amps/Volt. Voltage-to-current converters form the basic input structure of instrumentation amplifiers and are used as basic $G_m$ building blocks in frequency shaping devices. Generally, the value of $G_m$ in a conventional voltage to current converter is fixed and is determined by the circuit elements. Thus, the $G_m$ is fixed when the circuit is manufactured. It is possible, however, to vary the $G_m$ using programmable means on a circuit chip. In such a configuration, the $G_m$ could be varied by such programmable means according to a run-time configuration, rather than a predetermined configuration. These devices are used in programmable linear filters, gain amplifiers and other general purpose linear processing elements. Such transconducting devices, being building blocks of fixed and programmable components, have a large impact on the performance of the device in which they are incorporated. Conventional devices are limited in the manner and quality in which the $G_m$ value is set or otherwise programmed. Performance factors such as the accuracy with which the $G_m$ is set, the range over which the $G_m$ is set, the resolution over which the $G_m$ is set, and the linearity of the $G_m$ at a particular point are all factors that affect the performance of the $G_m$ device. Therefore, improving these factors in a $G_m$ device would improve the device's performance, as well as the component or other device within which it is incorporated. Therefore, there exists a need for $G_m$ devices having improved performance factors. As will be seen below, the invention accomplishes improved performance factors in an elegant manner.

SUMMARY OF INVENTION

The invention provides a method and apparatus for performing a voltage to current conversion. In particular, the invention provides a voltage to current converter configured to vary its $G_m$. Such a converter is configured to receive a voltage input signal combined with a reference voltage signal to be converted to a current output. Optionally, the reference voltage signal may be provided by a parabolic impedance network that includes a bank of resistors and a plurality of corresponding current sources. Each current source corresponds to each node between two resistors, and may be varied in order to program changes in the comparator's $G_m$. Each resistor and corresponding current source is configured to create an individual reference voltage reference having a value that occurs in a parabolic manner in relation to other voltage references occurring across the impedance network. The converter further includes a plurality of comparators corresponding to the plurality of voltage reference signals. The reference voltage is summed together with an input voltage to an input of each corresponding comparator. Each comparator is configured to receive an enabling signal source for receiving an enabling signal. The enablement signal source is configured to provide a variable input signal to further control the $G_m$ by varying the input current of the converter. The comparator includes a comparator output that outputs a signal when the comparator is enabled.

A circuit embodying the invention may include a plurality of transistor devices, wherein each device includes a pair of transistors. The discussion that follows describes a field effect transistor ("FET") device. The invention, however, is not limited to such a device. For example, a bipolar device may also be used with the base substituting for the gate, the collector substituting for drain and the emitter substituting for the source may be used. Each transistor device has individual gate, source and drain connections, and each of the pair of transistors is configured to receive a separate input at each of their respective source connections. Furthermore, each of the pair of transistors has a commonly connected gate. The other gate of each of the respective transistors is commonly connected with corresponding gates of transistors contained in each of the other transistor devices. The circuit further includes a voltage source configured to provide a reference voltage to the drain of one of the pair of transistors, and each of the other transistor devices also includes a corresponding voltage source at the drain of one of the pairs of the transistors of the respective device. Further, the device includes a current source connected with the gates of the two transistors that are commonly connected. The current source is configured to produce a variable current at the common junction of the two transistors, providing the ability to vary the $G_m$ of the voltage to current converter.

Such a circuit embodying the invention may include a parabolic bank of resistors configured to provide the reference voltage to the gate of one of the pair of transistors. When a voltage is applied to this bank of resistors, a different reference voltage is applied to the gate of one of a pair of transistors of each of the plurality of transistor devices. The parabolic bank of resistors may be further configured to provide a reference voltage in a manner that would produce reference voltages of any desirable character. In this configuration, the reference voltage provided to a first transistor device is of a relatively higher value than the reference voltage provided to an intermediate transistor device. Furthermore, the intermediate transistor device is of a minimum voltage value relative to the other transistor devices.

In an alternative configuration, the reference voltage provided to a first transistor device is of a relatively lower value than the reference voltage provided to an intermediate transistor device. The intermediate transistor device is of a maximum voltage value relative to the other transistor devices. Thus, if the output voltages were presented in graphical form, the graph would be in parabolic form, with a relative minimum or maximum value occurring at the center, depending on whether the parabola is in a concave upward or downward orientation respectively.

DETAILED DESCRIPTION

In one embodiment, a voltage to current converter is provided that includes a converter input for receiving a voltage input signal and a reference voltage signal to be converted to a current output. Alternatively, the converter may include a parabolic impedance network that includes a bank of resistors, a plurality of nodes occurring between each resistor and a plurality of current sources, where each current source corresponds to each node. Each resistor and corresponding current source is configured to create an individual voltage reference having a value that occurs in a parabolic manner in relation to other voltage references occurring across the impedance network. The converter further includes a plurality of comparators corresponding to the plurality of voltage reference signals. The parabolic impedance network is configured to provide parabolic reference voltage inputs to each comparator input. According to the invention, the reference voltage may be varied in a manner to vary the transconductance of the comparator. Each comparator is also configured to receive an enabling signal and to output a signal when the comparator is enabled. According to the invention, an enablement signal source is configured to provide a variable input signal to also vary the $G_m$ of the comparator.

The result is a voltage to current converter configured to accurately vary and set the $G_m$ of such a converter. Furthermore, the resolution and range over which the $G_m$ can be set is markedly improved. Also, the linearity of such a device is increased over this extended range. Improving these performance characteristics of the converter likewise improves the performance of devices that incorporate such converters. The invention is described below in one for use in converting voltage input signals to current output. It will be appreciated by those skilled in the art, however, that other useful applications of the invention may be implemented in applications where voltage to current converters are useful, without departing from the spirit and scope of the invention, where the scope is defined in the appended claims.

Figure 1:
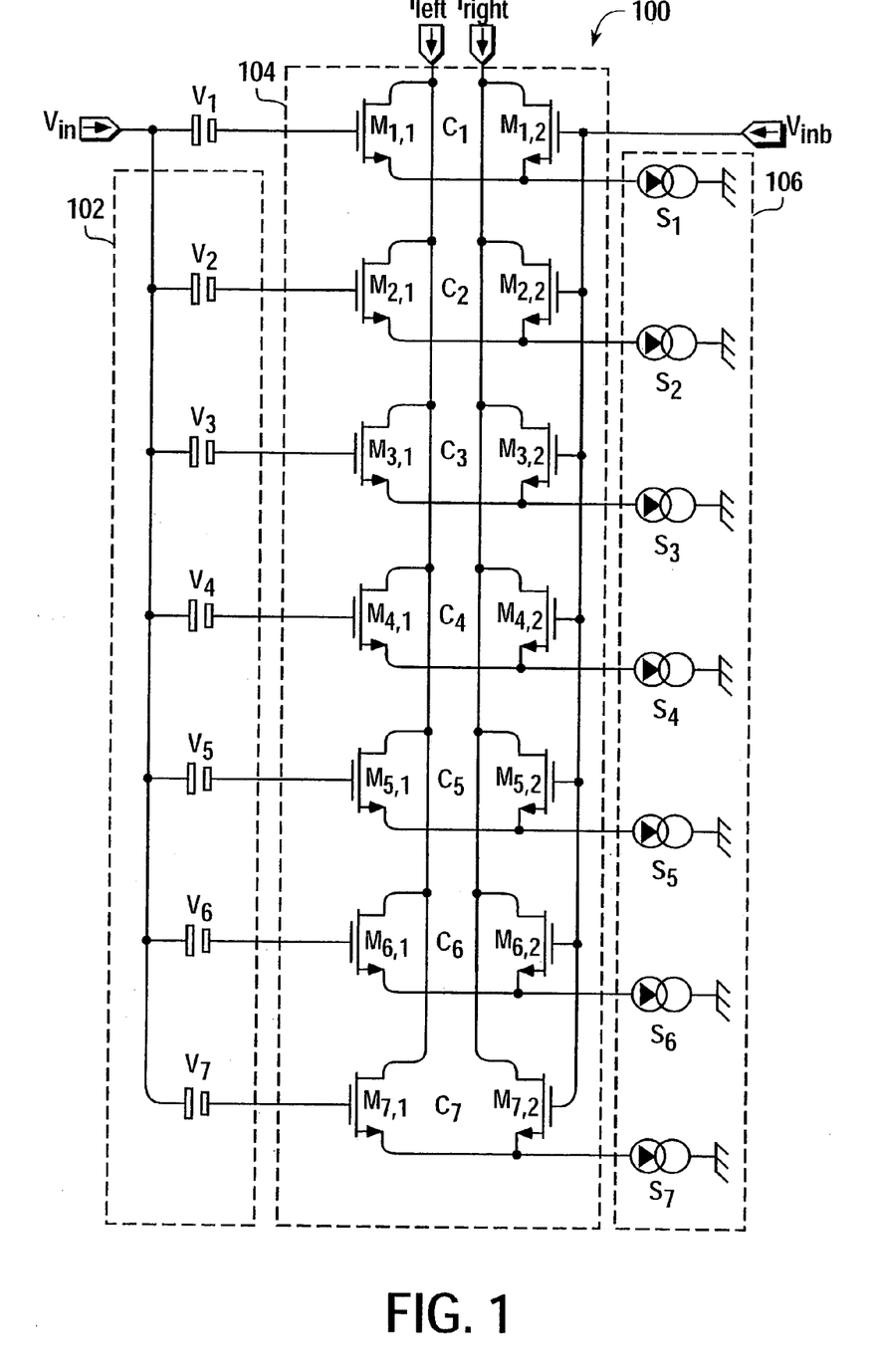
FIG. 1 is a diagrammatic view of a voltage to current converter according to the invention.

FIG. 1 is a diagrammatic view of a circuit embodying the invention. Converter circuit 100 is an example of a plurality of comparators 104, $C_1$, $C_2$, $C_3$, ... $C_N$ in a converter 100 that can be selectively enabled. According to the invention, the signal that enables the comparators can be individually varied to vary the transconductance of the converter as a whole. The outputs of comparators $C_1$, $C_2$, $C_3$, ... $C_N$ can then be compounded together to form the output of the converter 100. The manners in which the outputs can be compounded are well known in the art. Those skilled in the art will appreciate that there exists many method by which the outputs of the comparators may be summed or otherwise combined to produce an output indicative of the result of a voltage to current converter. Accordingly, the invention is not limited as such. Each of the plurality of comparators $C_1$, $C_2$, $C_3$, ... $C_N$ consists of a connection of components that has a linear output in proportion to a given input. In operation, the comparators are configured to each receive a voltage input $V_{in}$ summed together with a corresponding reference voltage $V_1$, $V_2$... $V_7$. According to the invention, the reference voltage steps between $V_1$, $V_2$ ... $V_7$ may be varied to vary the transconductance of the converter as a whole. The specific components making up the plurality of comparators, 104, $C_1$, $C_2$, $C_3$, ... $C_N$ in FIG. 1 is not limiting. It should be apparent to those skilled in the art in light of the following detailed description of the circuit in both FIGS. 1 and 8 that the comparators $C_1$, $C_2$, $C_3$, ... $C_N$ may be configured differently according to the invention to improve their linear input-output characteristic. Such a principle can be applied to any voltage to current converter having a plurality of comparators configured to vary the transconductance of the converter.

Each of the plurality of comparators $C_1$, $C_2$, $C_3$, ... $C_N$ outputs a quantity $I_{i,out}=I_i \cdot E_i$, where $1 \leq i \leq N$, and $I_i$ is the difference between the output currents $I_{Left}$ and $I_{Right}$. In this equation, $E_i$ is the value of an enabling signal. The enabling signal is a current that is varied in amplitude, all the comparators typically receiving the same enabling current. If the outputs $I_{i,out}$ of all of the comparators $C_1$, $C_2$, $C_3$, ... $C_N$ are added together as a group, the total output $I_{out}$ is:

$$I_{out} = I_{Left} - I_{Right} = \sum_{i=1}^{N} (I_{j,Left} - I_{j,right}) \quad (1)$$

According to the invention, if the value of E for all the comparators is varied between, 1.5 and 2 for example, the $G_m$ of the converter can be varied.

Referring again to FIG. 1, a converter 100 includes a bank 104 of N comparators $C_i$. Each comparator includes a pair of three-terminal semiconductor devices $M_{i,1}$ and $M_{i,2}$, $1 \leq i \leq N$. In a preferred embodiment, the low-impedance connections of the two devices are connected in common to one of a bank of current sources, $S_i$, 106. The bank of current sources 106 provides enabling signals for the individual comparators $C_i$. The three-terminal devices $M_{i,1}$ and $M_{i,2}$ can be, for example, field-effect transistor ("FET") or bipolar junction transistor ("BJT") devices. In any such specific configuration, the comparator $C_i$ will be responsive to the voltage difference at the gates or bases of the pair of devices, depending on how the device is configured. In a preferred embodiment, the high impedance connection is utilized, whether it is the gate or the base. Where each of $M_{i,1}$ and $M_{i,2}$ consists of an n-channel-type metal-oxide-semiconductor FET ("NMOS"), the sources of those devices would be connected together to a current source $S_i$. In operation, the current from current source $S_i$ would be split between the two devices $M_{i,1}$ and $M_{i,2}$ depending on the relative gate voltage of devices $M_{i,1}$ and $M_{i,2}$. Each pair of devices $M_{i,1}$ and $M_{i,2}$ together forms a comparator $C_i$ responsive to the voltage difference applied between the gates of the pair of devices $M_{i,1}$ and $M_{i,2}$. The voltage difference is in turn provided by an input impedance network. The drains of all devices $M_{i,1}$ are connected together to provide an output current $I_{left}$, and the drains of all devices $M_{i,2}$ are connected together to provide an output current $I_{right}$. The output of converter 100 can be considered the difference between the output currents $I_{left}$ and $I_{right}$, which are at nodes comprising sufficiently low impedance points to hold the appropriate voltage bias conditions.

In this example, each of the comparators $C_1, C_2, C_3, \ldots C_N$ is connected to corresponding voltage sources $V_1, V_2, V_3, \ldots V_N$ provides voltage having a value $V_s$. The voltage sources provided a reference voltage to be combined with $V_{in}$ to apply a voltage across the comparators as an input voltage $V_{in}$. According to the invention, the reference voltage $V_s$ may be varied in order to vary the $G_m$ of the corresponding comparator.

The input voltage $V_{in}$ is the difference between the signals $V_{left}$ and $V_{right}$. As the signal Vin is varied, the comparator with a zero input signal (i.e. the one that has no voltage difference between the gates) will vary dependant on the particular values of the voltage sources Vn. In this way, the comparators $C_1, C_2, C_3, \ldots C_N$ are responsive to the input signal $V_{in}$. In the example illustrated, N=7. However, those skilled in the art will appreciate that numerous variations in component numbers are possible without departing from the invention.

Figure 2:
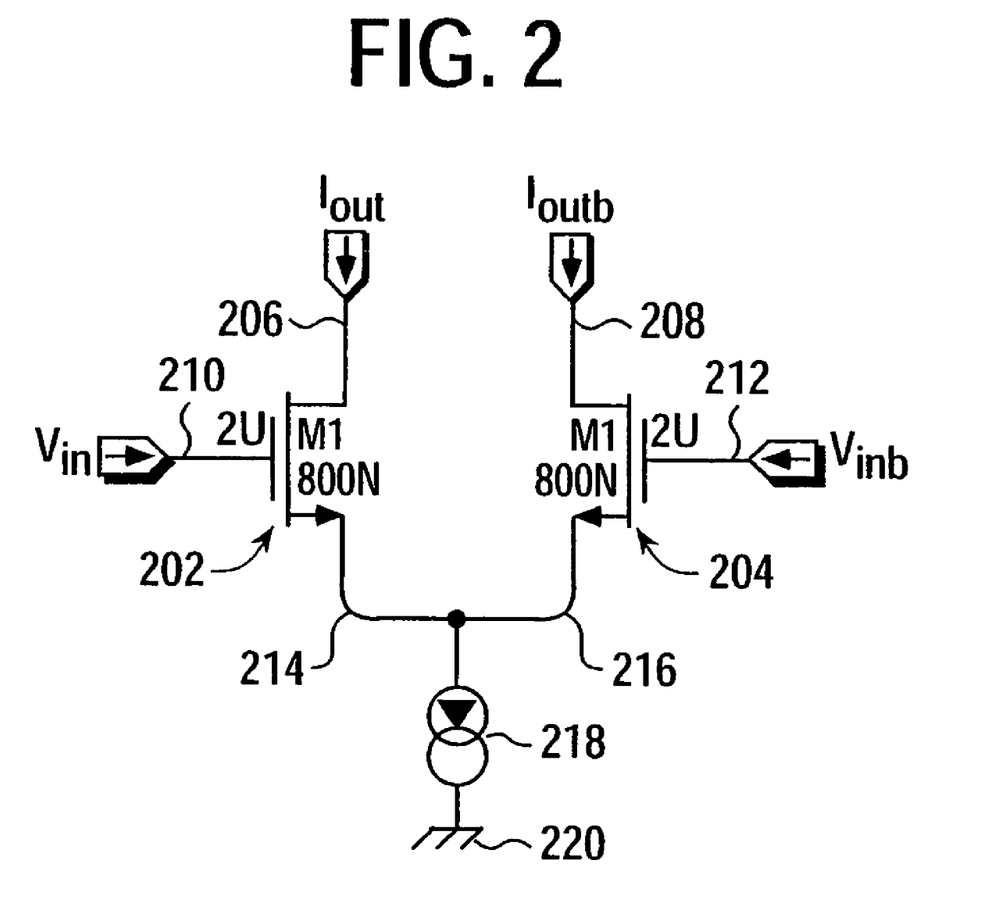
FIG. 2 is a diagrammatic view of a long tailed pair circuit utilized in FIG. 1.

Referring again to the circuit in FIG. 1, in operation, each of the current sources $S_i$ is able to provide an enabling signal in the form of a current that enables the pair of devices $M_{i,1}$ and $M_{i,2}$ that make up comparator $C_i$. Referring to FIG. 2, a schematic drawing of a three terminal component 200 known in the art as a long-tailed pair is illustrated. A long-tailed pair is a device made up of two three terminal elements such as FET or BJT type transistors that have their respective low impedance connections connected in common to a node that provides current. The long-tailed pair 200 is one of a compound set of long-tailed pairs that make up device 100. The long-tailed pair 200 shown in FIG. 2 includes two transistors 202, 204, each having a drain connection 206, 208, a gate 210, 212, and a source 214, 216. The source connections 214, 216 are connected in common, and are further connected to current sinking device 218. The current sinking device 218 is configured to draw a current from the drain 206 through transistor 202 to the source 214 and to ground connection 220. Similarly, the device 218 is further configured to draw a current from source 208 through transistor 204 to the source 216 and to ground connection 220. The device 200 can be characterized as a basic voltage to current converter. In operation, the device 200 is configured to receive voltage inputs $V_{in}$ and $V_{inb}$ at gates 210 and 212 respectively. These two terminals are subject to a voltage difference of the two voltage inputs, which may be of a varying nature. The device may be biased such that one voltage is at ground potential, and the other voltage is at another potential. If both voltages are equal, the input is zero volts. The current sinking device 218 provides an enabling signal to enable the operation of the transistors 202, 204 respectively. Once enabled, the transistors 204, 206 produce output currents $I_{out}$ and $I_{outb}$ at drains 206, 208 respectively. Similar to the input of the device, the output is the difference between the current values at drains 206, 208 respectively. If the input voltage is zero, the current drawn is split between the devices evenly, assuming that they are equivalent devices. Thus, they are both enabled to the same degree by the enabling current drawn by the current sinking device. According to the invention, the enabling current that is drawn using current sinking device 218 may be varied to vary the $G_m$ of the long-tailed pair.

Figure 3:
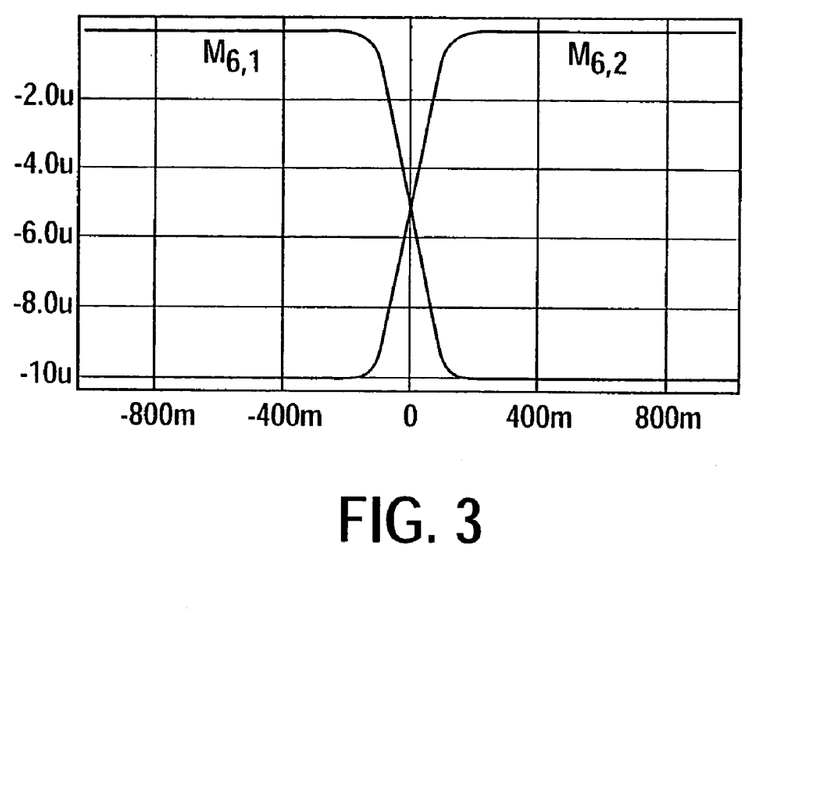
FIG. 3 is a graph showing the output signals of the long tailed pair circuit of FIG. 2.

FIG. 3 is a graph illustrating the relationship of the currents $I_{out}$ and $I_{outb}$ present at the drains 206, 208 of devices 202, 204 respectively, shown on the vertical axis, versus a range of input voltage differences ($V_{diff}=V_{in}-V_{inb}$) between the gates 210, 212 respectively, which are shown on the horizontal axis. The enablement signal provided to the device is a 10.0 $\mu$A current from current sinking device 220. It can be seen that, when viewed over the entire range of possible input voltage differences, the output current in the drains 206, 208 of the devices 202, 204 respectively, is not linear. This is clear looking from one extreme, where all of the current flows from current sinking device 218 to the drain 206 of device, to the other extreme, where all of the current flows to the drain 208 of device 204. However, if the circuitry making up long-tailed pair 200, this pairing of transistors 202, 204 operates only near the center of the transfer characteristic in the range close to zero, where the current splits approximately equally between the transistors 202, 204, increased linearity occurs where slight deviations from the center are linear, recognizing that there is a limited range of voltage differences that can be applied to the gates 210, 212 of the devices 202, 204 before one or the other of those devices saturates. For example, consider the region from the point where the output current changes from 40% of current flowing through device 202 and 60% of the current flowing through device 204, to the point where the output current changes from 60% of current flowing through device 202 and 40% of the current flowing through device 204. In this region, in practice, the linearity can be better than 1%.

Figure 4:
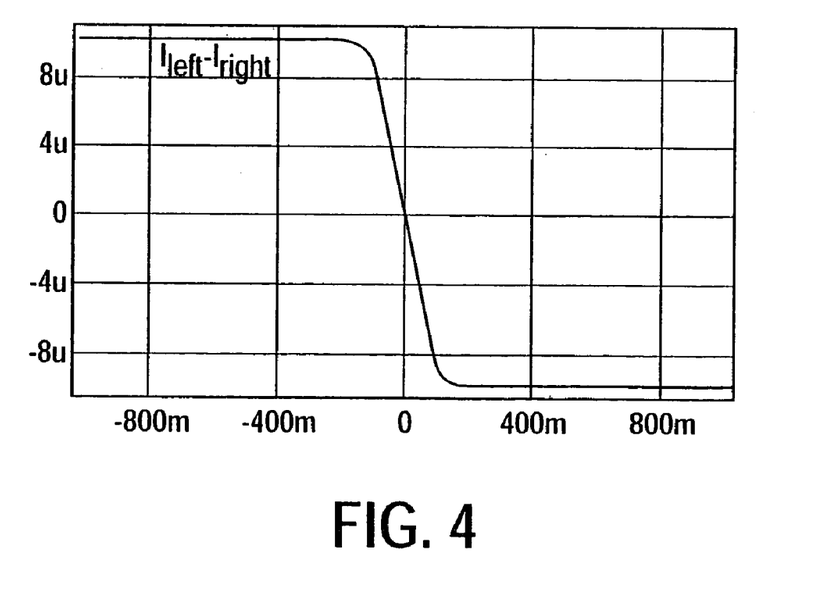
FIG. 4 is a graph showing the overall differential output of the converter of FIG. 1 when only a single given comparator is enabled, versus the difference in input signals to that comparator.
Figure 5:
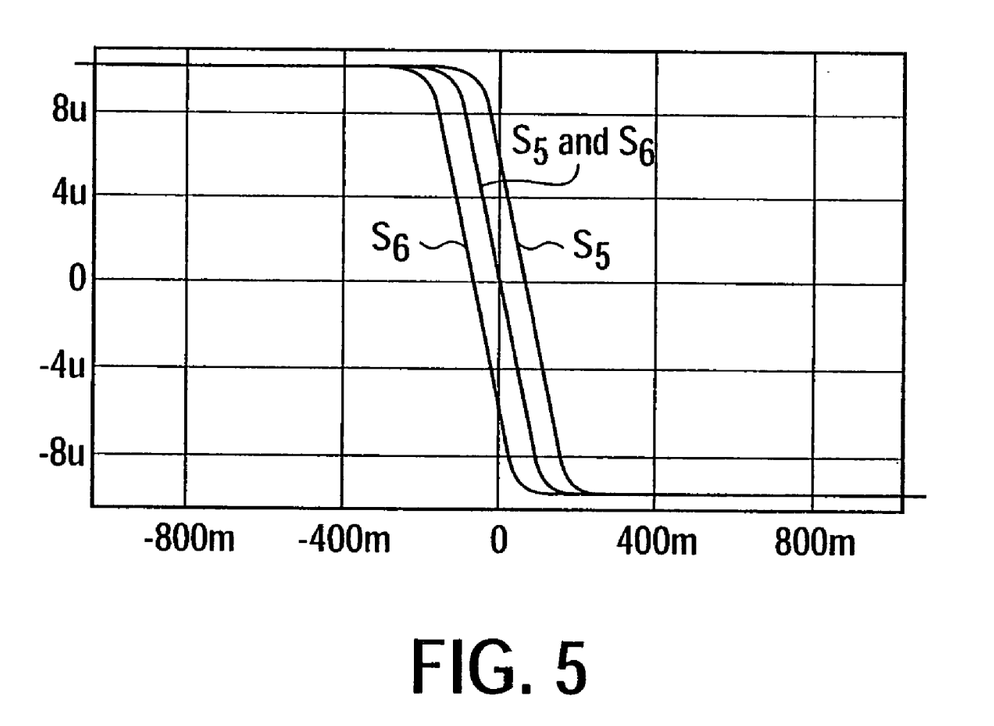
FIG. 5 is a graph illustrating the relationship between the two current sources and the input voltage of the circuit of FIG. 1.

Referring again to FIG. 1, when the drains of all devices $M_{i,1}$ are compounded together to provide output current $I_{left}$ and the drains of all devices $M_{i,2}$ are compounded together to provide output current $I_{right}$, $1 \leq i \leq N$. This compounding can be used to increase the region of linearity in the overall transfer characteristic. FIG. 4 shows the same data in FIG. 3, but the output is now considered to be the difference between the total drain currents. According to the invention, the region of linearity in this output signal in increased as a result of the overlapping of the transfer characteristic of the individual long tailed pair devices.

Figure 6:
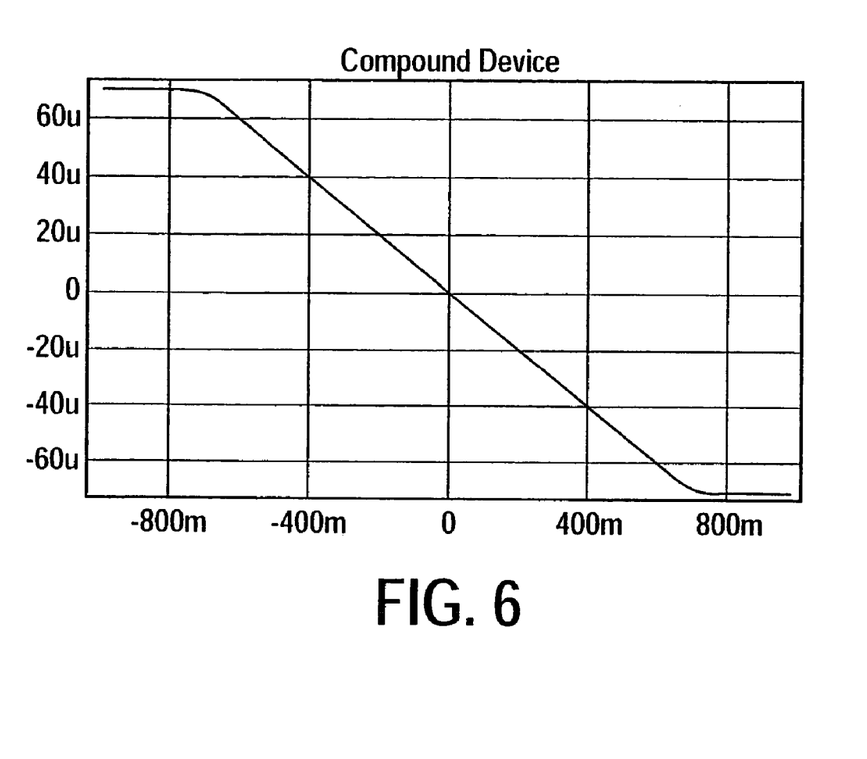
FIG. 6 is a graph illustrating the relationship between the output current and the input voltage of the circuit of FIG. 1.
Figure 7:
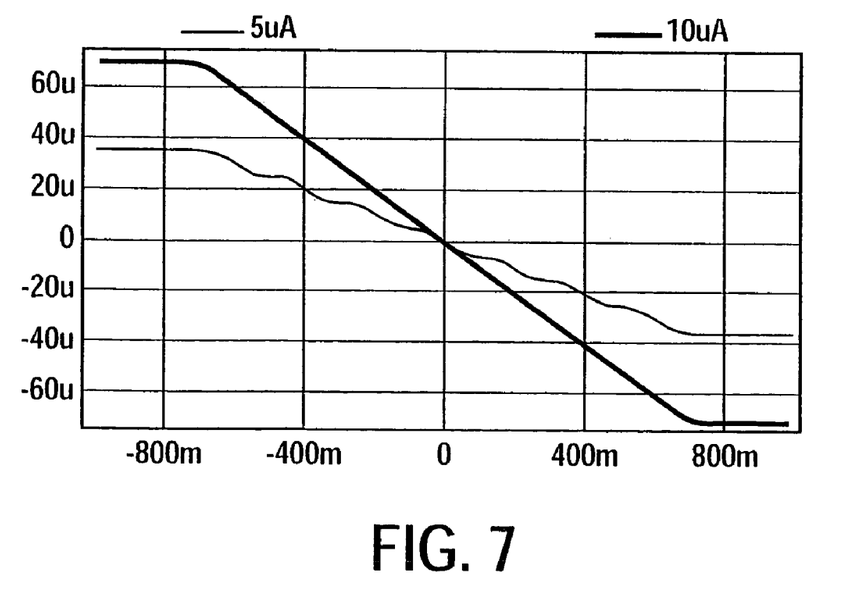
FIG. 7 is a graph illustrating the relationship between the output current and the input voltage of the circuit of FIG. 1 relative to the curve of FIG. 6 when the tail current is reduced.

Referring again to FIG. 1, and also referring to FIGS. 6 and 7, it can be seen how the $G_m$ of the series of transistors pairs can be varied. In the circuit of FIG. 1, the long-tailed pairs are offset such that the center of each device's response is slightly offset from its neighboring device. This may be achieved by a particular setting of the voltage sources Vn shown in FIG. 1. According to the invention, in lining up the long-tailed pairs in this manner, a degree of programmability is possible. Referring to FIG. 6, an illustration of the output current to input voltage relationship of the same device is illustrated where the tail current supplied by the current sinking device is reduced to 10 $\mu$A. A marked change in the linear range is illustrated in the curve of FIG. 6. The $G_m$ is 400 mV/40 $\mu$A=100 $\mu$S. Referring to FIG. 7, a comparison with the curve of FIG. 6 is illustrated in contrast to yet another curve. In this comparison, the voltages of the same device are recorded when the tail current supplied by the current sinking device is reduced to 5 $\mu$A. And, the $G_m$ has been reduced to 50 $\mu$S.

Thus, according to the invention, this method of varying the tail currents in the long tailed devices accomplishes the ability to program the $G_m$ of a device. Again, the compound set of long-tailed pairs is arranged such that the transfer characteristics overlap. Thus, in the device of FIG. 1, the $G_m$ may be programmable by varying the tail current of the compound arrangement of long-tailed pairs. Those skilled in the art will understand various methods of programming the variable tail current of the compound arrangement, and the invention is not limited to any particular method.

Figure 8:
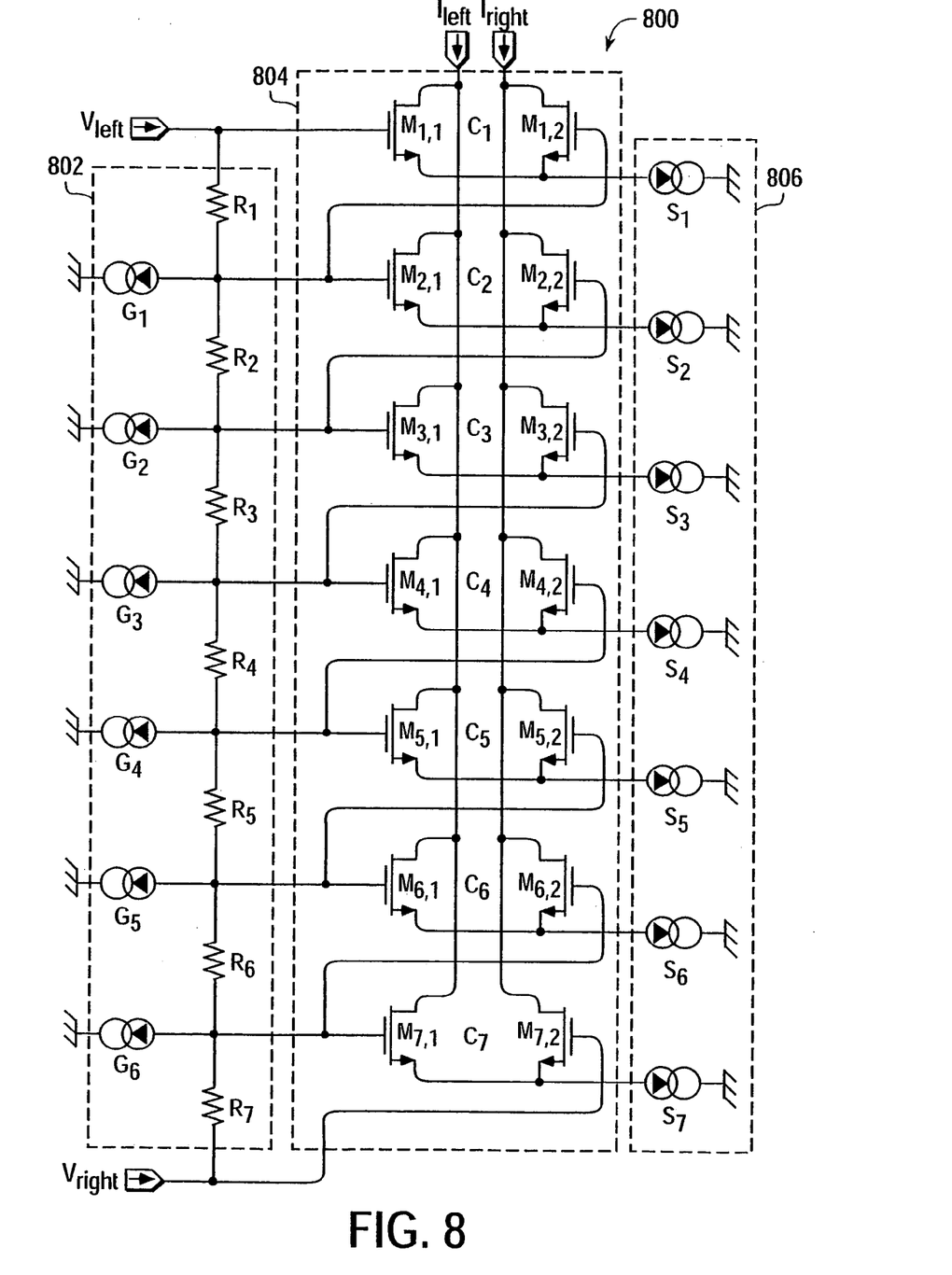
FIG. 8 is a diagrammatic view of the circuit of FIG. 1 incorporating a parabolic impedance network at the input.

Referring to FIG. 8, an alternative embodiment of a circuit embodying the invention is shown having a parabolic impedance network bank 802. In this example, each of the comparators $C_1, C_2, C_3, \ldots C_N$ made up of compounded long-tailed pairs of transistors is placed across a corresponding resistor $R_1, R_2, R_3, \ldots R_N$, each having a value R. These resistors are connected in series and define between them nodes from each of which a corresponding current source $G_1, G_2, G_3, \ldots G_N$ draws an equal current having a value $I_s$.

In operation, drawing from a bank 802 of current sources and corresponding resistors creates a parabolic profile of reference voltage signals. This parabolic profile ensures that only one of the comparators has a zero input voltage and that this comparator with a zero input voltage changes with the input signal $V_{in}$. The parabolic bank of transistors is configured to provide the reference voltage to the gate of the one of the pair of transistors. When a voltage is applied to this bank of resistors, $V_{left}-V_{right}$, a different reference voltage is applied to the gate of one of a pair of transistors of each of the plurality of comparators. The parabolic bank of resistors may be further configured to provide a reference voltage in a manner that would produce reference voltages in a parabolic manner. In this configuration, the reference voltage provided to a first comparator is of a relatively higher value than the reference voltage provided to an intermediate comparator. Furthermore, the intermediate comparator is of a minimum voltage value relative to the other comparators.

In an alternative configuration, the reference voltage provided to a first comparator is of a relatively lower value than the reference voltage provided to an intermediate comparator. The intermediate comparator is of a maximum voltage value relative to the other comparator. Thus, if the output voltages were presented in graphical form, the graph would be in parabolic form, with a relative minimum or maximum value occurring at the center, depending on whether the parabola is in a concave upward or downward orientation respectively. The upward or downward concave characteristic is a function of the amplitude and the sign of the current sources Gn. For example, if the sources Gn are current sinking, the parabola bends downward. In contrast, if the sources Gn are current sourcing, the parabola bends upward. In the limiting case if the sources Gn are all set to zero, the characteristic voltages present at the comparator inputs are linearly separated between Vleft and Vright. More particularly, in excel format, one example of the solution for Vleft and Vright, where both are set at zero volts, is (power(M/2−I, 2)+M/2−i)/2−(POWER(M/2,2)+M/2)/2.

The input voltage $V_{in}$ is the difference between the signals $V_{left}$ and $V_{right}$. The comparator at the vertex of the parabolic profile will vary as the input signal $V_{in}$ is varied. In this way, the comparators $C_1, C_2, C_3, \ldots C_N$ are responsive to the input signal $V_{in}$. Even though FIG. 8 shows the comparators connected to an input impedance network 802 configured to produce parabolic profile of reference voltage signals, the comparators $C_1, C_2, C_3, \ldots C_N$ can easily also be connected to an input impedance network in the same manner as other input impedance networks known in the art, without deviating from the principles of this invention.

Referring again to FIG. 4, the graph shows the currents present at the drains of devices $M_{6,1}$ and $M_{6,2}$ in response to a 10.0 μA current from current source $S_6$ on the vertical axis, versus a range of input voltage differences between the gates of devices $M_{6,1}$ and $M_{6,2}$ shown on the horizontal axis. It can be seen that, when viewed over the entire range of possible input voltage differences, the output current in the drain of the devices $M_{6,1}$ and $M_{6,2}$ is not linear—from one extreme of all the current from current source $S_6$ flowing to the drain of device $M_{6,1}$ to all of the current flowing to the drain of $M_{6,2}$; however, in the circuitry making up converter 800, this pairing of devices $M_{6,1}$ and $M_{6,2}$ operates only near the "center" of the transfer characteristic where the current splits approximately equally between the devices $M_{6,1}$ and $M_{6,2}$. This occurs where slight deviations from the "center" are linear, recognizing that there is a limited range of voltage differences that can be applied to the gates of the devices $M_{6,1}$ and $M_{6,2}$ before one or the other of those devices saturates. When the drains of all devices $M_{i,1}$ are compounded together to provide output current $I_{left}$ and the drains of all devices $M_{i,2}$ are compounded together to provide output current $I_{right}$, $1 \leq i \leq N$. This compounding increases the region of linearity in the overall transfer characteristic.

Altering the $G_m$ of the circuit 800 of FIG. 8 may now be described. Referring again to FIG. 8, as discussed above, the parabolic input circuit 802 is interconnected with the series 804 of compound long-tailed pair devices $C_1, C_2, C_3, \ldots C_7$. The input circuit includes a series of current sources $G_1, G_2, G_3, \ldots G_6$. According to the invention, the device 800 may be programmed to vary the current generated by the individual devices, thus varying the Gm of the compound device. Similarly, source bank 806 comprising current sources $S_1, S_2, S_3, \ldots S_7$ may also be varied according to a programmed device 800. It will be understood by those skilled in the art that various methods exist that may be employed to program the current level in each of the current sources current sources $S_1, S_2, S_3, \ldots S_7$ and $G_1, G_2, G_3, \ldots G_6$. The invention is not limited to any particular method or program configuration.

Figure 9:
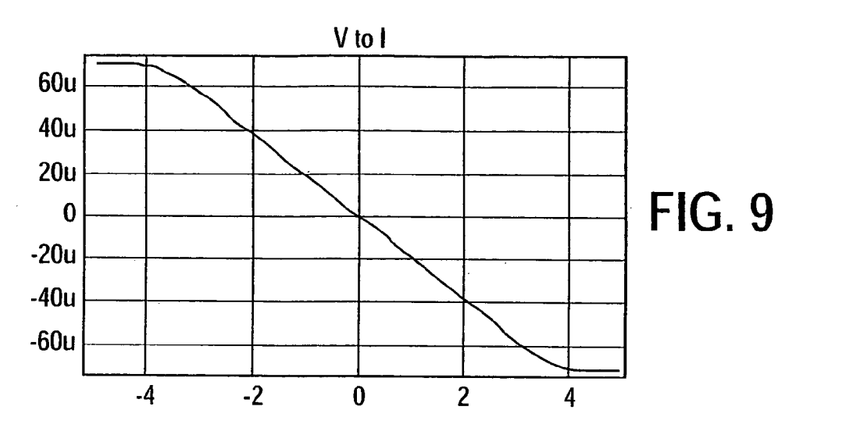
FIG. 9 is a graph illustrating the increase in linearity of the voltage to current converter of FIG. 8.
Figure 10:
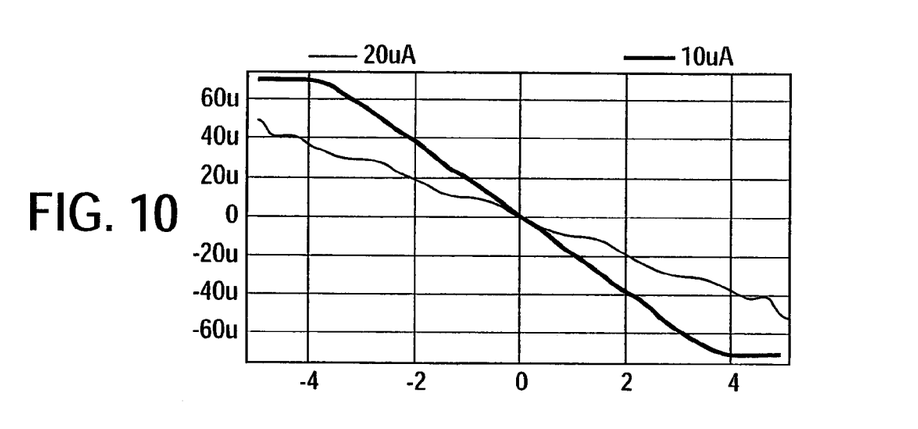
FIG. 10 is a graph illustrating the result of varying the tail current of a long-tailed pair and the input reference voltage of a voltage to current converter according to the invention.

Referring to FIG. 9, a graph of input voltage to output current of the circuit 800 of FIG. 8 is illustrated. FIG. 9 illustrates the relationship between the voltage input to circuit 800 and its current output for one of the series of compounded long-tailed pair devices. The circuit 800, unlike the similar circuit 100 of FIG. 1, requires no offset voltage source providing an offset voltage to the individual gates. In this example, offset voltages are provided by the parabolic impedance network, where the voltages are provided in a parabolic manner across the series of resistors $R_1$, $R_2, R_3, \ldots R_7$. In this example, the current input, $S_6$ for example, to the long-tailed pair is set to 10 μA, and the current input provided by the current input from the parabolic impedance network, current source $G_6$ for example, is set to 10 μA as well. The resistor, $R_6$ for example, is set to 30 kΩ. As is evident from the graph of FIG. 9, the $G_m$ has increased in linear range, and the $G_m$ value is 100 μS as before. This ability to vary both the long-tailed pair current sources as well as the parabolic input current sources provides an added degree of freedom to vary the $G_m$ of the circuit. Thus, varying the current source across the corresponding elemental resistor in the impedance network and separately varying the current source connected to the individual long-tailed pair can affect the $G_m$. Referring to FIG. 10, a graph is shown comparing the curve of FIG. 9 with a second curve where the current from the impedance network current source occurring across the corresponding resistor is decreased. The result is a decrease in the $G_m$. Thus, the $G_m$ of a given long-tailed pair can be decreased by increasing the corresponding current source within the parabolic impedance network. Thus, according to the invention, altering the $G_m$ of the comparators is accomplished by varying both the incoming current from a current source from the bank of current sources 802 or a current source from the other bank of current sources 806.

Figure 11:
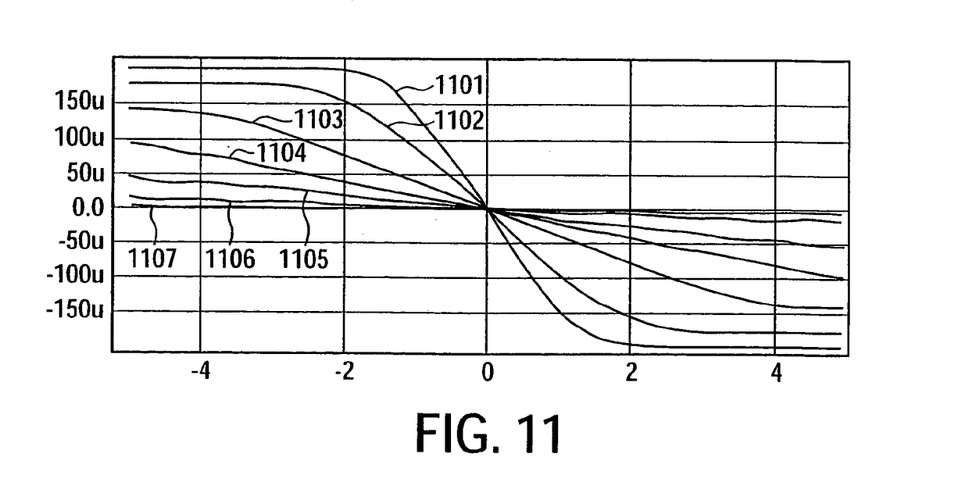
FIG. 11 is a graph illustrating several results of varying the tail current of a long-tailed pair and the input reference voltage of a voltage to current converter according to the invention.

Referring to FIG. 11, a series of curves, 1101 through 1107, is illustrated that each depict the relationship of input voltage versus output current of the circuit 800, FIG. 8. The currents measured at the long-tailed pair input range from 28 $\mu A$ to 2 $\mu A$, and the currents measured at the parabolic impendence network current source range from 2 $\mu A$ to 28 $\mu A$ respectively. In any particular graph, the total current is 30 $\mu A$. It can be seen from this series of graphs that the range of the $G_m$ varies from 1.5 $\mu S$ to 150 $\mu S$, a dynamic range of 100 to 1. These samples were taken from a circuit built and measured according to that of FIG. 8. In a circuit with even more comparators, the range would be even higher. It will be appreciated by those skilled in the art that the invention can be embodied in a number of different circuit configurations to achieve different results.

As will be apparent to those skilled in the art in the light of the foregoing disclosure, many alterations and modifications are possible in the practice of this invention without departing from the spirit or scope thereof.

The invention has been described with reference to a high performance voltage to current converter utilizing comparator circuits configured to produce outputs of greater resolution, better linearity and better accuracy. This is accomplished by alternatively varying the reference voltage provided by the impedance network and the current sinking device delivering current to the long-tailed pairs, thus varying the converter's transconductance, $G_m$. It will be appreciated by those skilled in the art, however, that the invention has broader utility. Other embodiments may be implemented according to the invention without departing from the spirit and scope of the invention, the scope of which is to be construed in accordance with the substance defined by the following claims.

What is claimed is:

1. A voltage to current converter having programmable tranconductance, comprising:
    a plurality of transistor devices arrayed in parallel, each device including a pair of transistors each having an individual gate, source and drain connections; the gate of one transistor in each of the pair of transistors being configured to receive an input voltage summed together with a corresponding first reference voltage from a respective first voltage source; each of the pair of transistors having a commonly connected source, the drains of each transistor pair providing an output current;
    a second voltage source configured to provide a corresponding second reference voltage to the gate of the other of the pair of transistors in each plurality; and
    a corresponding current source connected with the commonly connected sources, wherein each current source is configured to produce a variable current to vary the $G_m$ of the voltage to current converter.

2. A voltage to current converter according to claim 1, further comprising a parabolic bank of resistors configured as the first and second voltage sources to provide the first and second reference voltages, and configured to provide a different reference voltage to the gates of the pair of transistors of each of the plurality of transistor devices.

3. A voltage to current converter according to claim 2, wherein the parabolic bank of resistors is configured to provide the corresponding reference voltage to the gate of each of the pair of transistors of each of the plurality of transistor devices in a manner that would produce reference voltages in a parabolic manner, where the reference voltage provided to a first transistor device is of a relatively lower value than the reference voltage provided to an intermediate transistor device, and where the intermediate transistor device is of a high voltage value relative to the other transistor devices.

4. A voltage to current converter according to claim 2, wherein the parabolic bank of transistors is configured to provide a reference voltage to the gate of one of a pair of transistors of each of the plurality of transistor devices in a manner that would produce reference voltages in a parabolic manner, where the reference voltage provided to a first transistor device is of a relatively higher value than the reference voltage provided to an intermediate transistor device, and where the intermediate transistor device is of a minimum voltage value relative to the other transistor devices.

5. A voltage to current converter according to claim 1, wherein each pair of transistor devices includes first and second transistors, the first transistor having a its gate connected in common with one of the gate of other first transistors of the plurality of transistor devices and a first output, the second transistor having a source, drain and gate and having its gate connected in common with one of the gate of second transistors of other of the plurality of transistor pairs and a second output, the first transistor having one of its gate connected in common with one of the gate of the second transistor.

6. A voltage to current converter comprising:
    a converter input, for receiving a voltage input signal and a reference voltage signal to be converted to a current output;
    a parabolic impedance network coupled between the voltage input signal and the reference voltage signal, the network including a bank of resistors, a plurality of nodes occurring between each resistor and a plurality of current sources, where each current source corresponds to each node, wherein each resistor and corresponding current source is configured to create an individual voltage reference having a value that occurs in a parabolic manner in relation to other voltage references occurring across the impedance network;
    a plurality of comparators corresponding to the plurality of voltage references, wherein the parabolic impedance network provides parabolic reference voltages to an input of each corresponding comparator, and a comparator output, $S_1$, $S_2$, that outputs a signal when the comparator is enabled, wherein comparator the is configured to provide a variable $G_m$.

7. A voltage to current converter according to claim 6, wherein each of the plurality of comparators includes a pair of transistors sharing a common source receiving a variable current source configured to vary the $G_m$ of one of the transistors, where one of the transistors shares a drain output with a transistor of another of the plurality of comparators, wherein the parabolic bank of resistors is configured to provide the parabolic reference voltage to the gate of one of the pair of transistors of each of the plurality of transistor devices in a manner that would produce reference voltages in a parabolic manner, where the reference voltage provided to a first transistor device is of a relatively lower value than the reference voltage provided to an intermediate transistor device, and where the intermediate transistor device is of a high voltage value relative to the other transistor devices.

8. A voltage to current converter according to claim 7, wherein the
a parabolic impedance network provides a zero voltage difference between adjacent resistors which varies as a function of the analog input signal.

9. A method for converting a voltage input signal to a current output signal, comprising:
providing a converter having an input for receiving an analog input signal and a plurality of comparators for comparing the analog input signal directly or indirectly to a plurality of reference signals said voltage to current converter comprising:
a converter input, for receiving a voltage input signal and a reference voltage signal to be converted to a current output;
a parabolic impedance network coupled between the voltage input signal and the reference voltage signal, the network including a bank of resistors, a plurality of nodes occurring between each resistor and a plurality of current sources, where each current source corresponds to each node, wherein each resistor and corresponding current source is configured to create an individual voltage reference having a value that occurs in a parabolic manner in relation to other voltage references occurring across the impedance network;
a plurality of comparators corresponding to the plurality of voltage references, wherein the parabolic impedance network provides parabolic reference voltages to an input of each corresponding comparator, and providing a comparator output, that outputs a signal when the comparator is enabled, wherein the comparator is configured to provide a variable $G_m$; and
providing a plurality of reference signals corresponding to each of the plurality of comparators to vary the $G_m$.

10. A method as claimed in claim 9 wherein varying the $G_m$ is performed by varying the source current to the transistors of the comparator.

11. A method according to claim 9, further comprising varying the reference signals to vary the $G_m$ of the converter.

12. A method for converting voltage to current according to claim 9, wherein the parabolic bank of resistors is configured to provide the parabolic a reference voltage to the gate of one of the pair of transistors of each of the plurality of transistor devices in a manner that would vary the $G_m$ of the converter and to produce reference voltages in a parabolic manner, where the reference voltage provided to a first transistor device is of a relatively higher value than the reference voltage provided to an intermediate transistor device, and where the intermediate transistor device is of a minimum voltage value relative to the other transistor device.

* * * * *